(12) United States Patent
Yap

(10) Patent No.: US 6,242,933 B1
(45) Date of Patent: Jun. 5, 2001

(54) DEVICE PROBE SOCKET FORMING PART OF A TEST HEAD, INTERFACING BETWEEN TEST HEAD AND A PROBE HANDLER, USED FOR DEVICE STRIP TESTING

(75) Inventor: Liop-Jin Yap, Singapore (SG)

(73) Assignee: ST Assembly Test Services, Singapore (SG)

( * ) Notice: Subject to any disclaimer, the term of this patent is extended or adjusted under 35 U.S.C. 154(b) by 0 days.

(21) Appl. No.: 09/412,631

(22) Filed: Oct. 4, 1999

(51) Int. Cl.[7] .............................. G01R 1/04; G01R 31/02; G01R 31/26; H01R 4/50; H05K 3/34

(52) U.S. Cl. ...................... 324/755; 324/158.1; 324/754; 324/762; 324/765; 439/331; 29/840; 29/593; 430/317

(58) Field of Search ............................... 324/755, 158.1, 324/754, 762, 765; 439/331; 29/840, 593; 430/317

(56) References Cited

U.S. PATENT DOCUMENTS

| | | |
|---|---|---|
| 4,816,754 | 3/1989 | Buechele et al. ................ 324/761 |
| 5,180,974 * | 1/1993 | Mitchell et al. ................ 324/755 |
| 5,355,079 | 10/1994 | Evans et al. ................ 324/754 |
| 5,410,258 * | 4/1995 | Bowers et al. ................ 324/755 |
| 5,419,710 | 5/1995 | Pfaff ................ 439/266 |
| 5,420,506 | 5/1995 | Lin ................ 324/158.1 |
| 5,517,125 * | 5/1996 | Posedel et al. ................ 324/755 |
| 5,656,942 | 8/1997 | Watts et al. ................ 324/754 |
| 5,694,049 * | 12/1997 | Singh et al. ................ 324/755 |
| 5,742,170 * | 4/1998 | Issac et al. ................ 324/755 |
| 5,843,808 | 12/1998 | Karnezos ................ 438/121 |
| 5,852,870 * | 12/1998 | Freyman et al. ................ 29/841 |
| 5,859,538 * | 1/1999 | Self ................ 324/755 |
| 5,869,976 * | 2/1999 | Kelley et al. ................ 324/755 |
| 5,896,037 * | 4/1999 | Kudla et al. ................ 324/755 |
| 5,990,692 * | 11/1999 | Jeong et al. ................ 324/755 |
| 6,060,893 * | 5/2000 | Farnworth et al. ................ 324/755 |
| 6,104,201 * | 6/1998 | Beaman et al. ................ 324/755 |

* cited by examiner

Primary Examiner—Glenn W. Brown
Assistant Examiner—Wasseem H. Hamdan
(74) Attorney, Agent, or Firm—George O. Saile; Stephan B. Ackerman

(57) ABSTRACT

A new probe socket is provided that allows for high speed and dependable contacting of points of contact on the Device Under Test. The new probe socket is aimed at a testing environment where semiconductor devices are mounted on device or package strips.

15 Claims, 4 Drawing Sheets

DEVICE PROBE SOCKET FORMING PART OF A TEST HEAD, INTERFACING BETWEEN TEST HEAD AND A PROBE HANDLER, USED FOR DEVICE STRIP TESTING

This application is related to Ser. No. 09/412,631 filed on Oct. 4, 1999 assigned to a common assignee.

BACKGROUND OF THE INVENTION (1) Field of the Invention

The invention relates to the fabrication of integrated circuit devices, and, more particularly, to a method and apparatus for final testing semiconductor devices, such as of Ball Grid Array (BGA), Chip Scale Packaging (CSP), Quad Flat Pack (QFP), Quad Flat No-Lead (QFN) Integrated Circuit chips and others, that are mounted on strips.

(2) Description of the Prior Art

A Ball Grid Array (BGA) is an array of solderable balls placed on a chip carrier. The balls contact a printed circuit board in an array configuration where, after reheat, the balls connect the chip to the printed circuit board. BGA's are known with 40, 50 and 60 mils. spacings in regular and staggered array patterns.

In order to test a BGA device, the contactor elements of the BGA device are inserted into a contactor plate having a plurality of sockets. The contactor plate is coupled to a Device Under Test (DUT) loadboard, which is coupled to a testing machine. The DUT loadboard is in essence a printed circuit board that completes electrical connections between the BGA contactor elements via the contactor plate and the tester. In order to test the BGA device, the tester sends signals to and receives signals from the BGA device via the electrical conductor paths provided by the contactor plate and the DUT board.

At present the final testing of semiconductor Integrated Circuits is performed using Integrated Circuit Handler apparatus whereby each of the IC packages is handled as an individual unit and is advanced to the test socket of the DUT by either gravity feed or by using pick and place methods.

Mass production of semiconductor Integrated Circuits (IC's) brings with it the requirement that these IC's can be tested at high speed. Current trends in the semiconductor industry also promote convenient and bulk handling of semiconductor chips. While high speed testing has been current practice in the industry for a number of years, this testing in most cases handles individual chips. By mounting individual chips onto strips the flow of chips through the manufacturing and testing cycles can be greatly facilitated. This improved capability of handling a larger number of chips has to be accompanied with corresponding improvements in the testing capabilities for these chips. Moreover, strip testing also eliminates the use of trays for transportation and storage of individual chips throughout the whole testing process. This results in requirements for improved capabilities of handling chips that are mounted on strips in a testing environment. These improved capabilities transport chips at a rapid rate in and out of the test position. While in the test position, the chips must be contacted in a rapid and dependable way so that the chip can be tested. This contacting of the chip while the chip is in the position where it can be tested is done by means of probe sockets. The invention addresses a probe socket design that meets the requirements of rapidly and dependably contacting semiconductor devices for the purpose of testing these devices.

The present invention teaches an apparatus and method for testing integrated semiconductor circuits by means of device or package strip testing using probing techniques with a probe socket.

U.S. Pat. No. 5,355,079 (Evans et al.) shows a probe assembly for testing IC devices.

U.S. 5,420,506 (Lin) teaches an apparatus and method for testing packages.

U.S. Pat. No. 5,843,808 (Karnezos) shows a TAB grid array package made in strips.

U.S. Pat. No. 5,852,870 (Freyman et al.) teaches a Grid array assembly that includes a test step.

U.S. Pat. No. 4,816,754 (Buechele et al.) and U.S. Pat. No. 5,419,710(Pfaff) and U.S. Pat. No. 5,656,942(Watts) show various tester and holders. However, these references differ from the exact process of the invention.

SUMMARY OF THE INVENTION

It is the objective of the invention to provide apparatus and method for testing integrated semiconductor circuits by means of device strip testing using probing techniques with a probe socket.

The invention teaches, in accordance with the objective of the invention, a new probe socket that allows for high speed and dependable contacting of points of contact on the Device Under Test. The new probe socket is aimed at a testing environment where semiconductor devices are mounted on device or package strips.

DESCRIPTION OF THE PREFERRED EMBODIMENTS

Figure 1A:
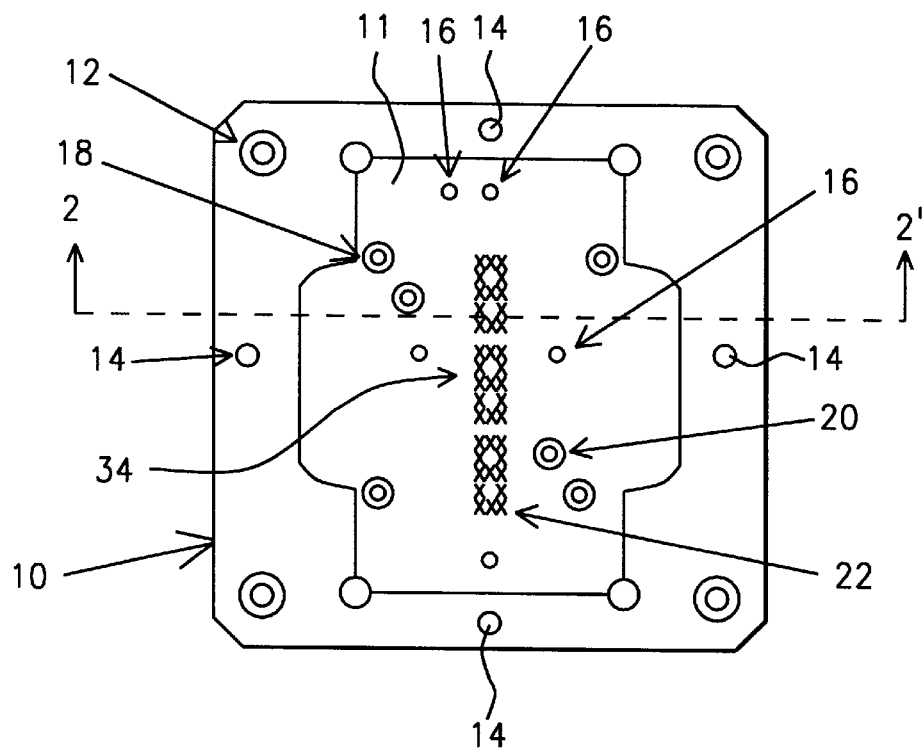
FIG. 1a shows a top view of the base of the probe socket.

Using the current practice of handling integrated circuit packages on an individual basis presents problems of handling the ever-decreasing size of the packages. Shrinking integrated circuit packages further aggravate the problems of increased tooling costs and increased lead time for test kit modifications due to the smaller IC packages and to the higher demands posed by the more accurate tolerances required for the smaller IC packages. Moreover, tooling up of trays for these packages for storage and transportation also incurs cost and lead time.

The present invention addresses these problems by using a new method of testing the IC packages. The need to handle IC packages on an individual basis is eliminated by using IC probing techniques applied by means of a modified probing apparatus and a probe socket whereby IC packages can be tested while handled in strip form (strip testing). The individual testing of each semiconductor device will in this manner be replaced by Device Strip Testing which will be performed by the modified probing apparatus, this probing apparatus is provided with a probe socket of the invention. The combination probing apparatus/probe socket allows for high speed testing of Integrated Circuits while these IC's are mounted on strips for convenient and speedy handling of the IC's. The time required to handle and test the integrated circuits will as a consequence be sharply reduced.

A plurality of individual BGA/QFP (or other type of) chips will be mounted on a strip, this strip will be referred to as the package strip. The package strip in turn will be mounted on an adhesive tape attached to a rigid platform for handling of the package strip before, during and after device testing operations. This platform will be referred to as the strip carrier frame. The number of BGA/CSP (and other types of) chips that can be mounted on one strip carrier frame is determined by the length of the package strip and by a particular package size. A strip carrier frame that, for instance, can handle a package strip with a length of 8 inches (this length can be increased or decreased to fit into a 12-inch wafer frame) is referred to as a 12-inch strip carrier frame.

The package strip is typically made of bismaleimide triazene (BT) substrate material. The BGA/QFN devices are strip mounted to the strip carrier frame using adhesive tape, this operation is a machine operation. The strip to strip carrier frame mount accuracy in the X and Y-directions is ±0.05 mm, the theta rotation accuracy is ±0.5 degrees.

A package strip is further subdivided into sites; each site contains a multiplicity of BGA/CSP chips or devices.

To summarize the above:
a multiplicity of BGA/CSP devices forms a site
a multiplicity of sites forms a package strip
one or more package strips may be mounted on a strip carrier frame.
the strip carrier frame provides the means for handling the BGA/CSP devices in the device probing apparatus using a new probe socket.

The probing apparatus of the present invention has the following performance characteristics:
1) be capable of handling 12 inch strip carrier frames while the probing apparatus can easily be modified to handle either larger or smaller strip carrier frames
2) use cassettes that serve as the means for handling a plurality of strip carrier frames in the environment of the probing apparatus with the new probe socket
3) use a loading/unloading arm for loading/unloading strip carrier frames into and from strip carrier frame cassettes
4) provide alignment of the Device Under Test (DUT)
5) be equipped with a loader/unloading transfer arm that transfers the strip carrier frame from the loading/ unloading arm to the device testing platform and that can handle 12-inch strip carrier frames and that can be easily modified to handle either larger or smaller strip carrier frames
6) be equipped with a main chuck and heater table that secures the DUT during testing and that can handle 12-inch strip carrier frames and that can easily be modified to handle either larger or smaller strip carrier frames
7) provide two types of stepping capabilities, that is device to device within a site and site to site within a package strip.

Referring now specifically to FIG. 1a, there is shown a top view of the base 10 of the probe socket. The probe socket consists of two units, that is a socket base 10 and a socket top cover. The top cover of the probe socket is not shown in FIGS. 1a through 1c and will be further detailed under FIGS. 2a through 2c and FIGS. 3a and 3b following. The top cover of the probe socket is mounted over the opening 11 that is shown in FIG. 1a in a direction that is the same as the longest dimension of this opening 11.

A number of the detailed items that are indicated in FIG. 1a are for purposes of positioning the base of the probe socket while in the device test environment, as follows:
12 represents a M3 screw or the means that is used to fasten the socket base to the load-board or test-board
14 are 0.3 mm diameter dowel pins that are located in the socket base and that serve or provide the means as a guide to the load-board or the test-board
16 are 2.0 mm diameter dowel pins that are located in the socket base and that serve or provide the means as a guide for the socket top cover
18 represents M2 screws that are used and provide the means to fasten the socket top cover and the socket base onto the load-board or the test-board
20 represents M2 screws that are used and provide the means to fasten the socket top cover to the socket base, and
22 are openings into which the pogo pins reside.

Figure 1B:
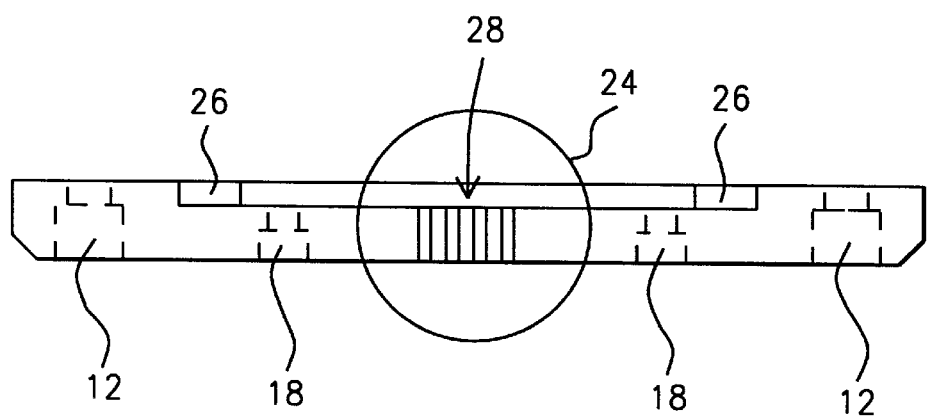
FIG. 1b shows a cross section of the base of the probe socket.

FIG. 1b shows a cross section of the base of the probe socket as taken along the line 2–2' in FIG. 1a. The relative positions of openings 12 and 18 are indicated even though the cross section 2–2' does not directly intersect with these openings. Contained within the circle 24 of FIG. 1b is a cross section of the areas where the pogo pins will reside. The pogo pins are the pins that make electrical contact with the points of contact in the Device Under Test (DUT) and are further detailed in FIG. 1c. Of interest to note in FIG. 1b is the opening 26 that is provided in the top surface of the base of the probe socket. The top cover of the probe socket, to be discussed under FIGS. 2a through 2c, fits into this opening, pogo pins provided in the top cover of the probe socket make contact with pogo pins provided in the base of the probe socket along the interface 28.

The area 24 in FIG. 1b is the area that contains a plurality of pogo pins 28 (drilled holes) for pogo pins, the pogo pins when placed into such openings will make contact between the load-board and the DUT. The pogo pins are to be mounted in the base of the socket, that is in the openings for the contact points 28 shown in FIG. 1b, and are therefore the parts of the pogo pins that are directly in contact with the Device Under Test (see FIG. 4 for a better overview of this).

Figure 1C:
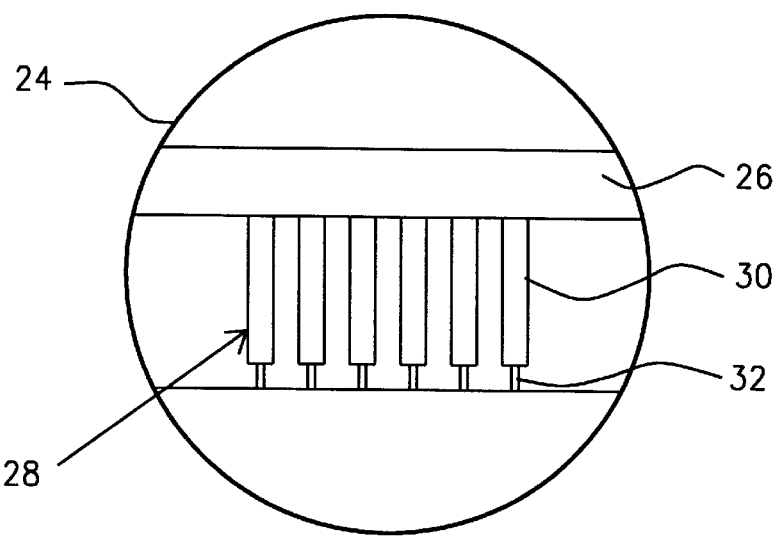
FIG. 1c shows a magnified view of a sub-section of the cross section of the base of the probe socket.

FIG. 1c shows a blow-up of the areas of the openings for the pogo pins contained within the highlighted circle 24 of FIG. 1b. Area 26 again is the area into which the top cover of the probe socket will be positioned. Each of openings for pogo pins shown in FIG. 1c has a main body 30 that steps into a narrower section 32. It is at this narrower section 32 that the tip of the pogo pin makes contact with the points of contact of a Device Under Test.

Figure 2A:
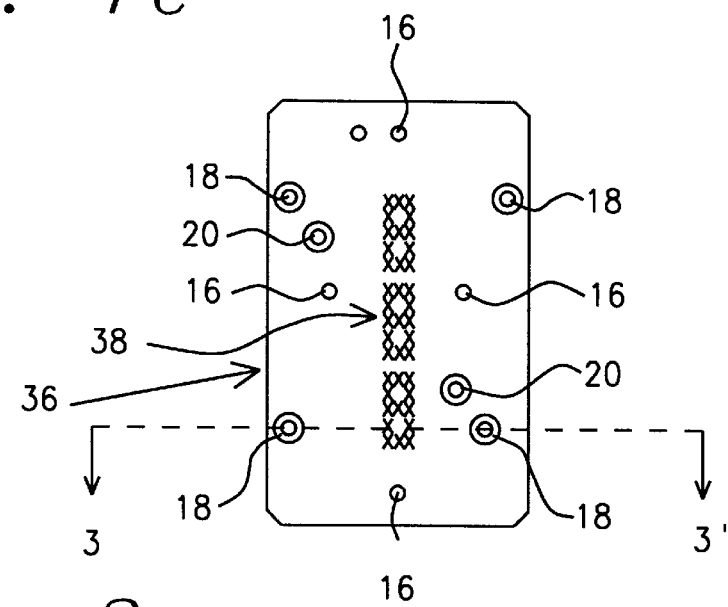
FIG. 2a shows a top view of the top cover of the probe socket.
Figure 2B:
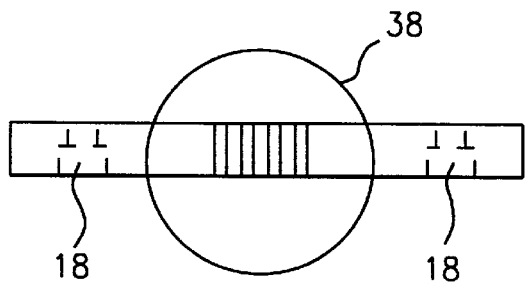
FIG. 2b shows a cross section of the top cover of the probe socket.

FIGS. 2a and 2b shows a top view and a cross section of the top cover 36 of the probe socket. Items of positioning, such as 16, 18 and 20, have previously been discussed under FIG. 1a and do not need to be addressed at this point. Area 38 indicates the area in which a plurality of pogo pins are mounted. It must again be remembered that the top cover of the probe socket in inserted into the base of the probe socket, as previously indicated as opening 26 under FIG. 1b.

FIG. 2b shows a cross section of the top cover of the probe socket as taken along the line 3–3' of FIG. 2a. Circle 38 contains areas where the pogo pins will reside and are further detailed in FIG. 2c.

Figure 2C:
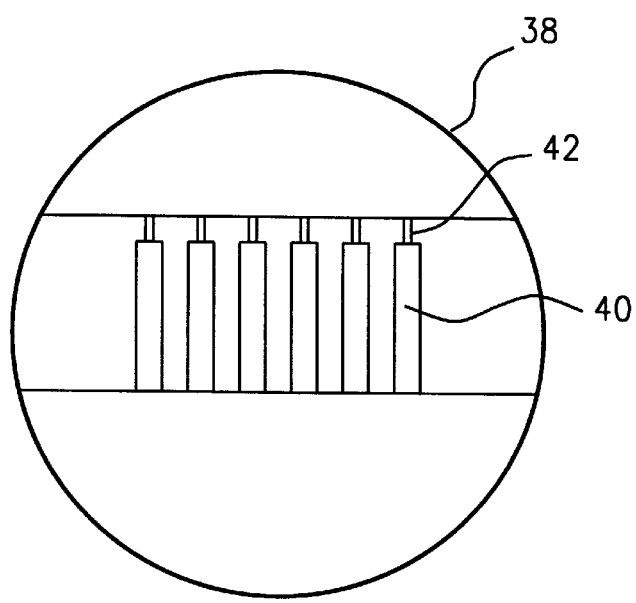
FIG. 2c shows a magnified view of a sub-section of the cross section of the top cover of the probe socket.

FIG. 2c shows a blow up of a sub-section of the cross section that is shown in FIG. 2b. Within the circle 38 are contained openings where pogo pins will reside, each of the openings has a main body 40 that steps into a narrower section 42. The areas of openings of circle 38 will meet and match the areas of openings of circle 24 and the pogo pins will reside and be enclosed within these openings. The upper sections 42 of the pogo pins shown in FIG. 2c make contact with the load board.

Figure 3A:
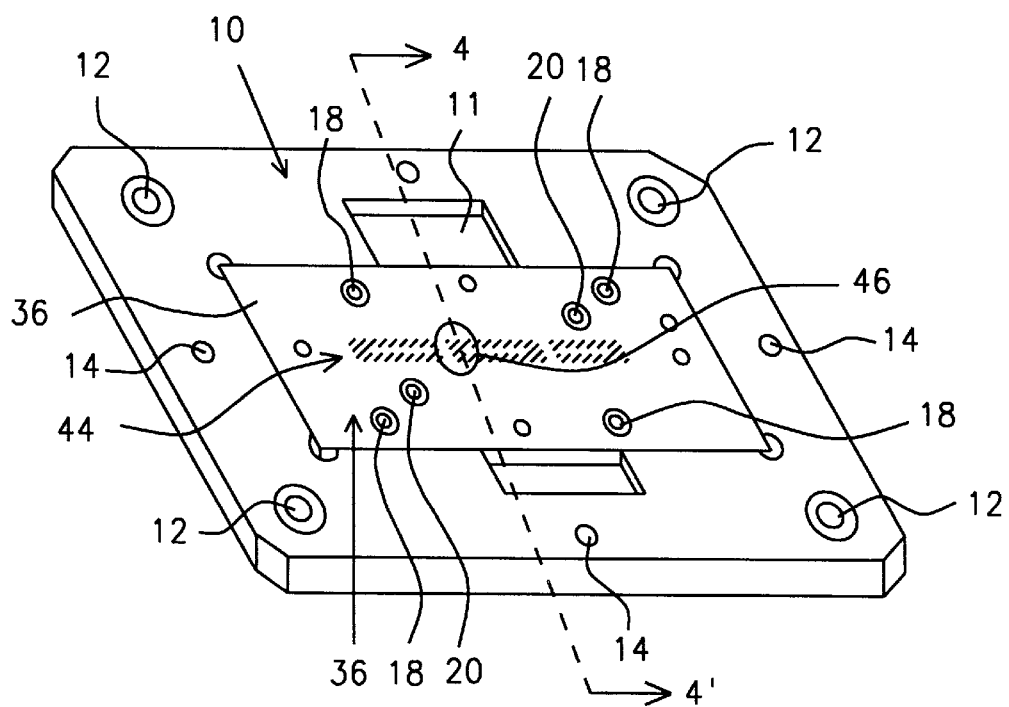
FIG. 3a shows a perspective view of the base of the probe socket combined with the top cover of the probe socket of the invention.

FIG. 3a shows a perspective view of the base 10 of the probe socket with the top 36 of the probe socket inserted into the base. The area 44 presents a perspective view of the multiplicity of pogo pins that have been mounted in the probe socket; this perspective view is the view that faces the load-board.

Figure 3B:
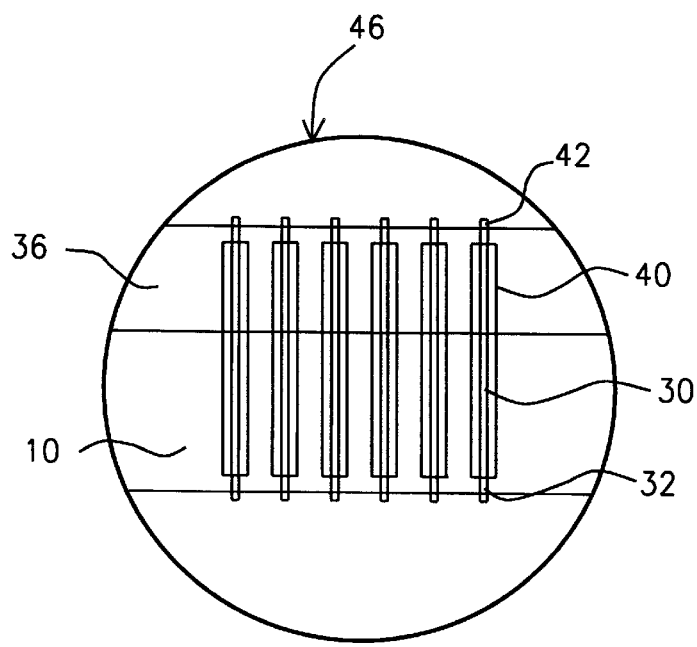
FIG. 3b shows a cross section of the combined pogo pins of the invention.

FIG. 3b presents a cross section of 46 of an array of pogo pins that has been taken along the line 4-4' in FIG. 3a. The section 10 is the cross section of the base of the probe socket; section 36 is a cross section of the top of the probe socket.

The electrical contact between the load-board and the DUT is now clear: the upper part of the pogo pin (for instance part 42 in FIG. 3b) makes contact with the load board, from the upper part 42 of the pogo pins extending the electrical contact through the body of the pogo pins (for instance part 40 and part 30 of FIG. 3b; sharing similar pins) into the lower part (for instance part 40 in FIG. 3b), the lower part contacts a matching pogo pin (for instance pogo pin 30 in FIG. 3b) extending the electrical contact through the upper part of this pogo pin into the lower part (for instance part 32, in FIG. 3b) which lower part makes contact with the DUT.

From the preceding paragraph it is clear that the top cover as shown in FIGS. 2a and 3a contains a multiplicity of pogo pins in an array of pogo pins that align with and provide a multiplicity of paths of electrical contact between a plurality of points of contact in the loadboard and a plurality of points of contact in the Device Under Test.

Figure 4:
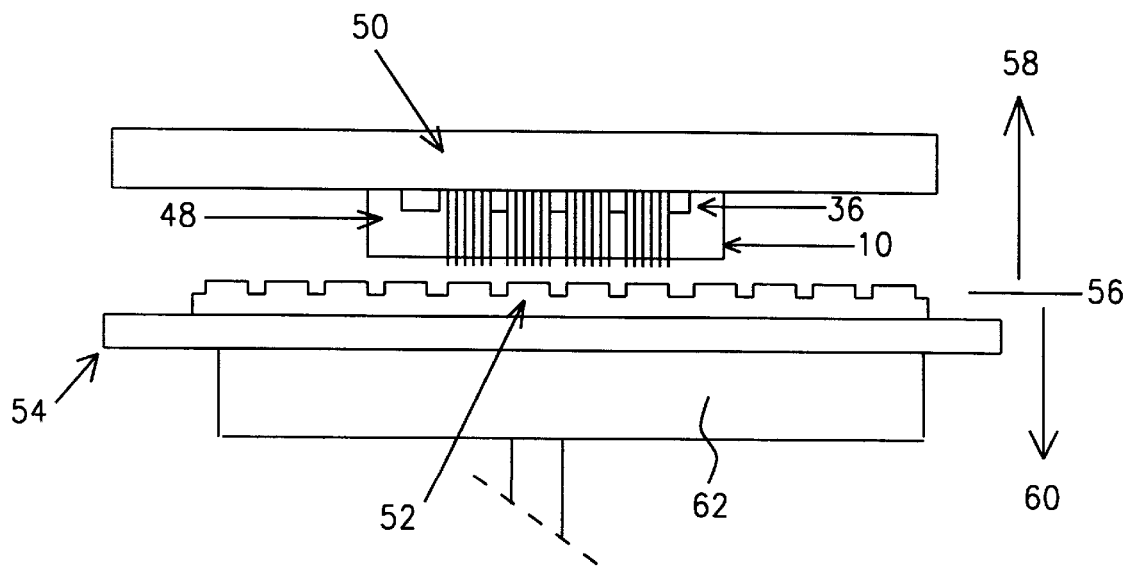
FIG. 4 shows a cross section of the probe socket in the device test environment.

FIG. 4 shows a cross section of the probe socket 48 in the test environment. The base 10 and the top 36 of the probe socket are readily identifiable. The top cover 36 of the probe socket interfaces with the loadboard 50 while the socket base 10 interfaces with the contact points of the DUT that are mounted on the strip carrier frame 54. The interface 56 forms, from a systems point of view, the interface between the testhead 58 and the probe handler 60. The strip carrier frame 54 is mounted on a chuck 62 that directly interfaces with and is part of the probe handler. Element 52 is the device carrier strip and is therefore the region where the Device Under Test (not shown in FIG. 4), which is supported by the strip carrier frame 54., is contacted by the probe socket 48 of the invention. This chuck provides four directions of motion, that is X, Y, Z and rotational directions. The probe handler 60 and its related chuck 62 have been described in detail in the related co-pending and co-assigned application.

Specifically indicated in FIG. 4 are the device package or carrier strip 52 and the strip carrier frame 54. The device package strip 52 can be mounted on the strip caroier frame 54 by an adhesive layer or by clamping (not shown in FIG. 4) of the device package strip 52 to the strip carrier frame 54. Both methods of attachment are well known in the art.

The probe socket and the therewith provided top cover of the invention can be used to test the following semiconductor devices but is not limited to these devices; Ball Grid Array (VGA), Land Grid Array (LGA), Quad Flat Pack (QFP), Quad Flat NoLead (QFN) and Pin Grid Array (PGA) devices and any other device that can be mounted on a device strip.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of interfacing between a test board and a probe handler for high-speed semiconductor device testing, comprising:

a probe socket, said probe socket comprising a socket base and a socket top cover, said socket base comprising means for socket base alignment, said socket base further comprising an opening for insertion of said socket top cover, said socket base further comprising a multiplicity of openings with a multiplicity of pogo pins to contact a Device Under Test, said opening for insertion of said socket top cover aligning with said socket top cover thereby allowing alignment, insertion and attachment of said top cover to said socket base, said socket top cover comprising means for aligning and attaching said socket top cover to said socket base plate, said socket top cover further comprising a multiplicity of openings for pogo pins;

a device package strip, at least one semiconductor device being mounted on said device package strip;

a strip carrier frame, at least one device package strip being mounted on said strip carrier frame; and a means for mounting said device package carrier strip to a strip carrier frame.

2. The method of claim 1, said means of socket base alignment comprising:

a means for fastening the socket base to a load-board or a test-board;

a means serving as a guide to a load-board or a test-board;

a means serving as a guide for the socket top cover;

a means for fastening the socket top cover and the socket base onto a load-board or a test-board; and a means for fastening the socket top cover to the socket base.

3. The method of claim 1, said multiplicity of pogo pins at the socket base for contacting a Device Under Test being an array of pogo pins aligning with and providing a multiplicity of paths of electrical contact between a plurality of points of contact in a Device Under Test and a plurality of points of contact in a loadboard.

4. The method of claim 1, said means for aligning and attaching said socket top cover to said socket base plate comprising:

a means serving as a guide for the socket top cover;

a means for fastening the socket top cover and the socket base onto a load-board or a test-board; and a means for fastening the socket top cover to the socket base.

5. The method of claim 1, said multiplicity of pogo pins at the top cover being an array of pogo pins aligning with and providing a multiplicity of paths of electrical contact between a plurality of points of contact in a loadboard and a plurality of points of contact in a Device Under Test.

6. The method of claim 1 wherein said device being selected from the group consisting of Ball Grid Array (BGA), Land Grid Array (LGA), Quad Flat Pack (QFP), Quad Flat No-Lead (QFN) and Pin Grid Array (PGA) devices and any other device that can be mounted on a device strip.

7. The method of claim 1, wherein said means for mounting said device package carrier strip to said strip carrier frame being adhesive tape.

8. An apparatus for interfacing between a test board and a probe handler for high-speed semiconductor device testing, comprising:

a probe socket, said probe socket comprising a socket base and a socket top cover, said socket base comprising means of socket base alignment, said socket base further comprising an opening for insertion of said socket to cover, said socket base further comprising a multiplicity of openings at socket base pogo pins for contacting a Device Under Test, said socket top cover comprising means for aligning and attaching said socket top cover to said socket base plate, said socket top cover further comprising a multiplicity of openings at the top cover for pogo pins;

a device package strip, at least one semiconductor device being mounted on said device package strip;

a strip carrier frame, at least one device package strip being mounted on said strip carrier frame; and a means for mounting said device package carrier strip to a strip carrier frame.

9. The apparatus of claim 8, said means of socket base alignment comprising:

a means for fastening the socket base to a load-board or a test-board;

a means serving as a guide to a load-board or a test-board;

a means serving as a guide for the socket top cover;

a means for fastening the socket top cover and the socket base onto a load-board or a test-board; and a means for fastening the socket top cover to the socket base.

10. The apparatus of claim 8, said opening for insertion of said socket top cover aligning with said socket top cover thereby allowing alignment, insertion and attachment of said top cover to said socket base.

11. The apparatus of claim 8, said multiplicity of pogo pins at the socket base for contacting a Device Under Test being an array of pogo pins aligning with and providing a multiplicity of paths of electrical contact between a plurality of points of contact in a Device Under Test and a plurality of points of contact in a loadboard.

12. The apparatus of claim 8, said means for aligning and attaching said socket top cover to said socket base plate comprising:

a means serving as a guide for the socket top cover;

a means for fastening the socket top cover and the socket base onto the load-board or the test-board; and a means for fastening the socket top cover to the socket base.

13. The apparatus of claim 8, said multiplicity pogo pins at the top cover being an array of pogo pins aligning with and providing a multiplicity of paths of electrical contact between a plurality of points of contact in a loadboard and a plurality of points of contact in a Device Under Test.

14. The apparatus of claim 8, said device being selected from the group consisting of Ball Grid Array (BGA), Land Grid Array (LGA), Quad Flat Pack (QFP), Quad Flat No-Lead (QFN) and Fin Grid Array (PGA) devices and any other device that can be mounted on a device strip.

15. The apparatus of claim 8, said means for mounting said device package carrier strip to said strip carrier frame being adhesive tape.

\* \* \* \* \*